US008982259B2

(12) United States Patent
Yoo et al.

(10) Patent No.: US 8,982,259 B2
(45) Date of Patent: Mar. 17, 2015

(54) ANALOG-TO-DIGITAL CONVERTERS AND RELATED IMAGE SENSORS

(75) Inventors: Kwi Sung Yoo, Seoul (KR); Min Ho Kwon, Seoul (KR); Wun-Ki Jung, Suwon-si (KR); Jin Ho Seo, Seoul (KR); Dong Hun Lee, Yongin-si (KR); Seung Hyun Lim, Yongin-si (KR); Jae Hong Kim, Daegu (KR)

(73) Assignee: Samsung Electronics Co., Ltd. (KR)

( * ) Notice: Subject to any disclaimer, the term of this patent is extended or adjusted under 35 U.S.C. 154(b) by 397 days.

(21) Appl. No.: 13/348,044

(22) Filed: Jan. 11, 2012

(65) Prior Publication Data
US 2012/0176501 A1    Jul. 12, 2012

(30) Foreign Application Priority Data
Jan. 11, 2011    (KR) .................. 10-2011-0002764

(51) Int. Cl.
H04N 5/335    (2011.01)
H03M 1/16    (2006.01)
H03M 3/00    (2006.01)
H04N 5/378    (2011.01)
H03M 1/50    (2006.01)

(52) U.S. Cl.
CPC .............. H03M 1/164 (2013.01); H03M 3/458 (2013.01); H04N 5/378 (2013.01); H03M 1/50 (2013.01); H03M 3/424 (2013.01); H03M 3/456 (2013.01)
USPC ......................................... 348/302

(58) Field of Classification Search
USPC .......... 341/155, 156, 157, 158, 172; 348/241, 348/297, 300, 302, 308
See application file for complete search history.

(56) References Cited

U.S. PATENT DOCUMENTS

| 7,227,490 | B2 * | 6/2007 | Kawahito ...................... 341/156 |
| 7,830,294 | B2 * | 11/2010 | Feldotte et al. ............... 341/167 |
| 7,889,111 | B2 * | 2/2011 | Kawahito ...................... 341/162 |
| 8,040,264 | B2 * | 10/2011 | Hummerston et al. ........ 341/118 |
| 8,248,289 | B2 * | 8/2012 | Bright et al. ................... 341/162 |
| 2005/0190093 | A1 * | 9/2005 | Mayer ............................ 341/155 |
| 2007/0126619 | A1 * | 6/2007 | McGrath ....................... 341/155 |
| 2007/0153126 | A1 * | 7/2007 | Sonobe ......................... 348/537 |
| 2010/0328122 | A1 * | 12/2010 | Li ................................... 341/122 |

FOREIGN PATENT DOCUMENTS

| JP | 2002-124877 | 4/2002 |
| JP | 2004-304413 | 10/2004 |
| JP | 2010-103893 | 5/2010 |

* cited by examiner

*Primary Examiner* — Aung S Moe
*Assistant Examiner* — Amy Hsu
(74) *Attorney, Agent, or Firm* — Myers Bigel Sibley & Sajovec

(57) ABSTRACT

An image sensor includes a pixel array including a plurality of pixels which are arranged in a matrix of a plurality of rows and columns and each of the plurality of pixels being configured to convert intensity of incident light into an electrical image signal; and an extended counting analog-to-digital converter configured to perform a first analog-to-digital conversion to provide a digital signal from an output signal of the pixel array, to obtain a residue using the output signal of the pixel array and the digital signal, and to perform a second analog-to-digital conversion using the residue.

15 Claims, 13 Drawing Sheets

FIG. 8

$$\frac{D_1 = 1 \quad D_0 = 1}{D_1 = 0 \quad D_0 = 1} \; 0.25V$$
$$\frac{D_1 = 0 \quad D_0 = 1}{D_1 = 0 \quad D_0 = 0} \; -0.25V$$

FIG. 9

$V_{refH}$ ——————————— 0.5[V]

$V_{COM1}$ ——————————— 0.25[V]
$V_{COM2}$ ——————————— 0.125[V]
$V_{CM}$ ——————————— 0[V]
$-V_{COM2}$ ——————————— -0.125[V]
$-V_{COM1}$ ——————————— -0.25[V]

$-V_{refL}$ ——————————— -0.5[V]

ANALOG-TO-DIGITAL CONVERTERS AND RELATED IMAGE SENSORS

CROSS-REFERENCE TO RELATED APPLICATION

This application claims priority to Korean Patent Application No. 10-2011-0002764 filed Jan. 11, 2011, the disclosure of which is hereby incorporated herein by reference.

FIELD

The present inventive concept generally relates to an analog-to-digital converter (ADC) and, more particularly, to ah ADC and an image sensor including the same.

BACKGROUND

An analog-to-digital converter (ADC) used in an image sensor typically requires performance for high speed, high resolution and low power. However, conventional ADCs usually have a long conversion time to provide high resolution and a lot of power is generally consumed to reduce the conversion time.

SUMMARY

Some embodiments of the present inventive concept provide an image sensor including a pixel array comprising a plurality of pixels arranged in a matrix of a plurality of rows and columns, each of the plurality of pixels being configured to convert intensity of incident light into an electrical image signal; and an extended counting analog-to-digital converter configured to perform a first analog-to-digital conversion to provide a digital signal from an output signal of the pixel array, to obtain a residue using the output signal of the pixel array and the digital signal, and to perform a second analog-to-digital conversion using the residue.

In further embodiments, the extended counting analog-to-digital converter may include a first analog-to-digital converter configured to convert the output signal of the pixel array into a digital signal, a first adder configured to obtain the residue using the output signal of the pixel array and the digital signal output from the first analog-to-digital converter, and a second analog-to-digital converter configured to convert the residue into a digital signal.

In still further embodiments, the extended counting analog-to-digital converter may further include a second adder configured to add the digital signal output from the first analog-to-digital converter and the digital signal output from the second analog-to-digital converter.

In some embodiments, the extended counting analog-to-digital converter may include an integrator configured to integrate one of the output signal of the pixel array and a first reference signal and a comparison block configured to convert an output signal of the integrator into a digital signal based on at least one comparison signal.

In further embodiments, the extended counting analog-to-digital converter may further include a digital-to-analog converter block configured to perform digital-to-analog conversion on an output signal of the comparison block.

In still further embodiments, the extended counting analog-to-digital converter may further include a digital filter configured to accumulate the output signal of the comparison block.

In some embodiments, the image sensor may further include a reference generator configured to generate the first reference signal and the at least one comparison signal.

In further embodiments, the extended counting analog-to-digital converter may further include a multiplexer configured to selectively output one signal among the output signal of the pixel array and the first reference signal.

In still further embodiments, the extended counting analog-to-digital converter may further include an adder block configured to invert a sign of an output signal of the digital-to-analog converter block and output an inverted signal to an input terminal of the integrator.

Some embodiments of the present inventive concept provide an analog-to-digital converter including a multiplexer configured to selectively output one of an output signal of a pixel array and a first reference signal, an integrator configured to integrate an output signal of the multiplexer, a comparison block configured to convert an output signal of the integrator into a digital signal based on at least one comparison signal and output a first output signal, a digital-to-analog converter block configured to perform digital-to-analog conversion on the first output signal received from the comparison block, an adder block configured to invert a sign of an output signal of the digital-to-analog converter block and output an inverted signal to an input terminal of the integrator, and a digital filter configured to accumulate the first output signal of the comparison block.

In further embodiments, the integrator may include an amplifier having an input terminal connected with an output terminal of the multiplexer via at least one capacitor. At least one switch and at least one capacitor may be connected in parallel between the input terminal of the amplifier and an output terminal of the amplifier. At least one of two terminals of the at least one capacitor may be connected with one of the input and output terminals of the amplifier.

In still further embodiments, the output terminal of the multiplexer may be connected with the at least one capacitor via a first switch.

In some embodiments, a second reference signal may be input to terminals of the at least one capacitor except for a terminal connected to the input terminal of the amplifier according to a switching signal.

In further embodiments, the integrator may configured to integrate the output signal of the multiplexer according to an operation of the at least one switch and the switching signal.

In still further embodiments, the integrator may perform an operation on an output feedback signal received from the adder block through an input terminal and the output signal of the pixel array and obtain a residue.

BRIEF DESCRIPTION OF THE DRAWINGS

The above and other features and advantages of the present inventive concept will become more apparent by describing in detail exemplary embodiments thereof with reference to the attached drawings in which:

FIG. 8 is a diagram for explaining the operation of the comparison block illustrated in FIG. 7.

FIG. 9 is a diagram illustrating output signals of a reference generator illustrated in FIG. 1.

DETAILED DESCRIPTION OF THE EMBODIMENTS

Figure 1:
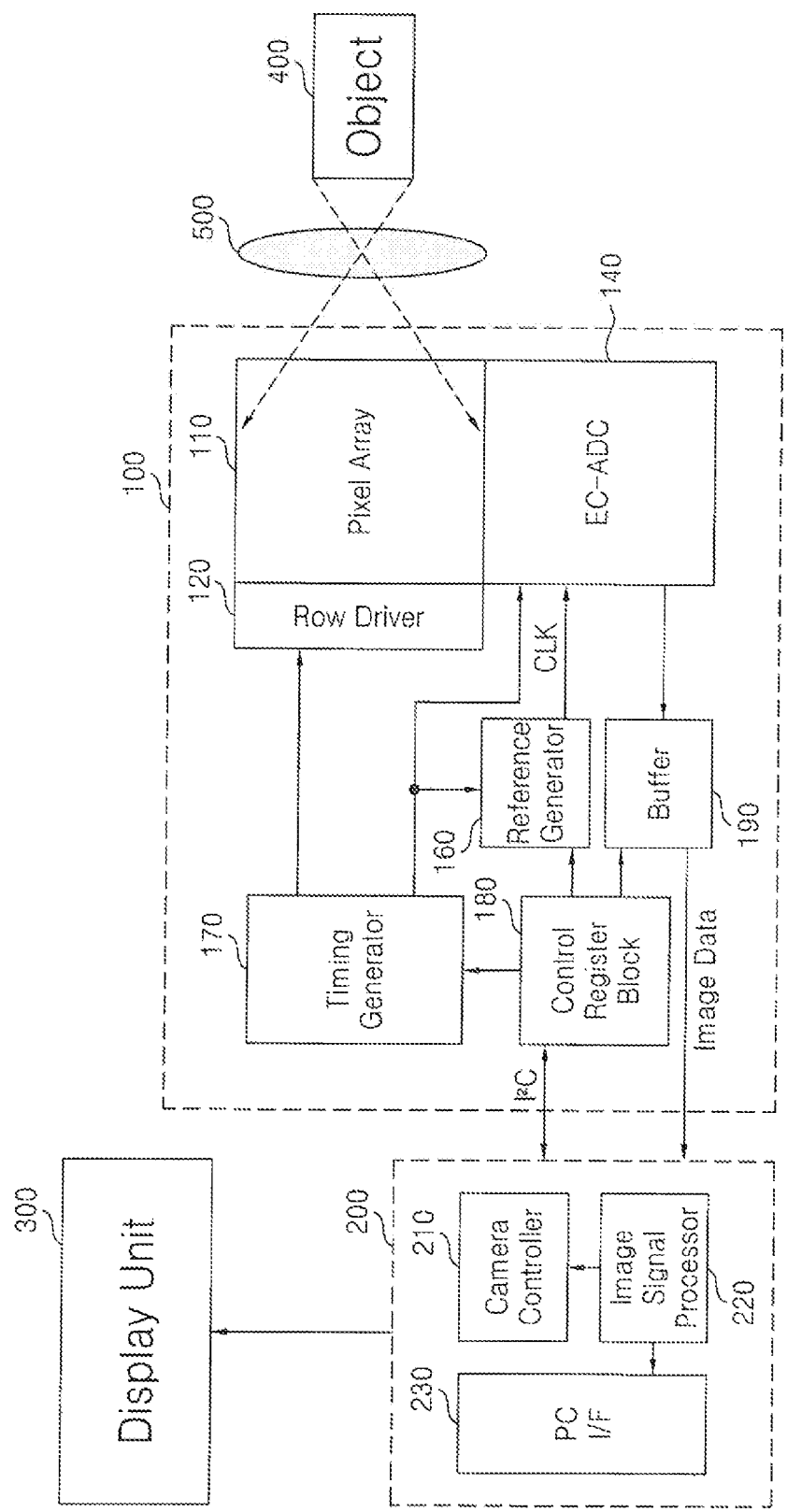
FIG. 1 is a schematic diagram illustrating an image sensor according to some embodiments of the present inventive concept.

The present inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Referring first to FIG. 1, a schematic diagram illustrating an image sensor 100 according to some embodiments of the present inventive concept will be discussed. As illustrated in FIG. 1, the image sensor 100 includes a pixel array 110, a row driver 120, an extended counting analog-to-digital converter (EC-ADC) 140, a reference generator 160, a timing generator 170, a control register block 180, and a buffer 190.

The image sensor 100 is controlled by an image processor 200 to sense an object 400 photographed through a lens 500. The image processor 200 may output an image, which has been sensed and output by the image sensor 100, to a display unit 300. At this time, the display unit 300 may be any device that can output an image. For example, the display unit 300 may be a computer, a mobile phone, or any type of image display terminal.

The image processor 200 includes a camera controller 210, an image signal processor 220, and a personal computer (PC) interface (I/F) 230. The camera controller 210 controls the control register block 180. The camera controller 210 may control the image sensor 100, and more specifically, the control register block 180 using an inter-integrated circuit ($I^2C$), but the scope of the present inventive concept is not restricted thereto.

The image signal processor 220 receives image data, i.e., an output signal of the buffer 190, performs a processing operation on the image data to generate an image which has a high image quality, and outputs the image to the display unit 300 through PC I/F 230.

Although the image signal processor 220 is positioned within the image processor 200 in FIG. 1, embodiments of the present inventive concept are not limited to this configuration. For example, the image signal processor 220 may be positioned within the image sensor 100 without departing from the scope of the present inventive concept.

The pixel array 110 includes a plurality of photo sensitive devices such as photo diodes or pinned photo diodes. The pixel array 110 senses light using the photo sensitive devices and converts the light into an electrical signal to generate an image signal.

The timing generator 170 may output a control signal to the row driver 120, the EC-ADC 140, and the reference generator 160 to control the operations of the row driver 120, the EC-ADC 140, and the reference generator 160. The control register block 180 may output a control signal to the reference generator 160, the timing generator 170, and the buffer 190 to control the operations of the elements 160, 170, and 190. The control register block 180 is controlled by the camera controller 210.

The control register block 180 outputs a control signal to the reference generator 160 to control the range of a reference voltage output by the reference generator 160. For example, the control register block 180 may control the range of the reference voltage to be from about 0.5 V to about 1.0V. When the range of the reference voltage is controlled to be reduced by half from 1.0 V to 0.5 V, the gain of the EC-ADC 140 may be doubled.

The row driver 120 drives the pixel array 110 in units of rows. For example, the row driver 120 may generate a row selection signal. The pixel array 110 outputs to the EC-ADC 140 a reset signal and an image signal from a row selected by the row selection signal received from the row driver 120.

The EC-ADC 140 may perform correlated double sampling (CDS) on the reset signal and the image signal, output a result signal using reference signals output from the reference generator 160 and a CDS signal, count the result signal, and output a count result to the buffer 190.

The EC-ADC 140 may include a plurality of blocks performing analog-to-digital conversion in at least two stages and may perform the analog-to-digital conversion using a residue, which will be discussed below with reference to FIGS. 3A through 8.

The buffer 190 temporarily stores a digital signal output from the EC-ADC 140 and senses and amplifies the digital signal before outputting it. The buffer 190 may include a plurality of column memory blocks, for example, static random access memories (SRAMs), provided for respective columns for temporal storing; and a sense amplifier sensing and amplifying the digital signal received from the EC-ADC 140.

Figure 2:
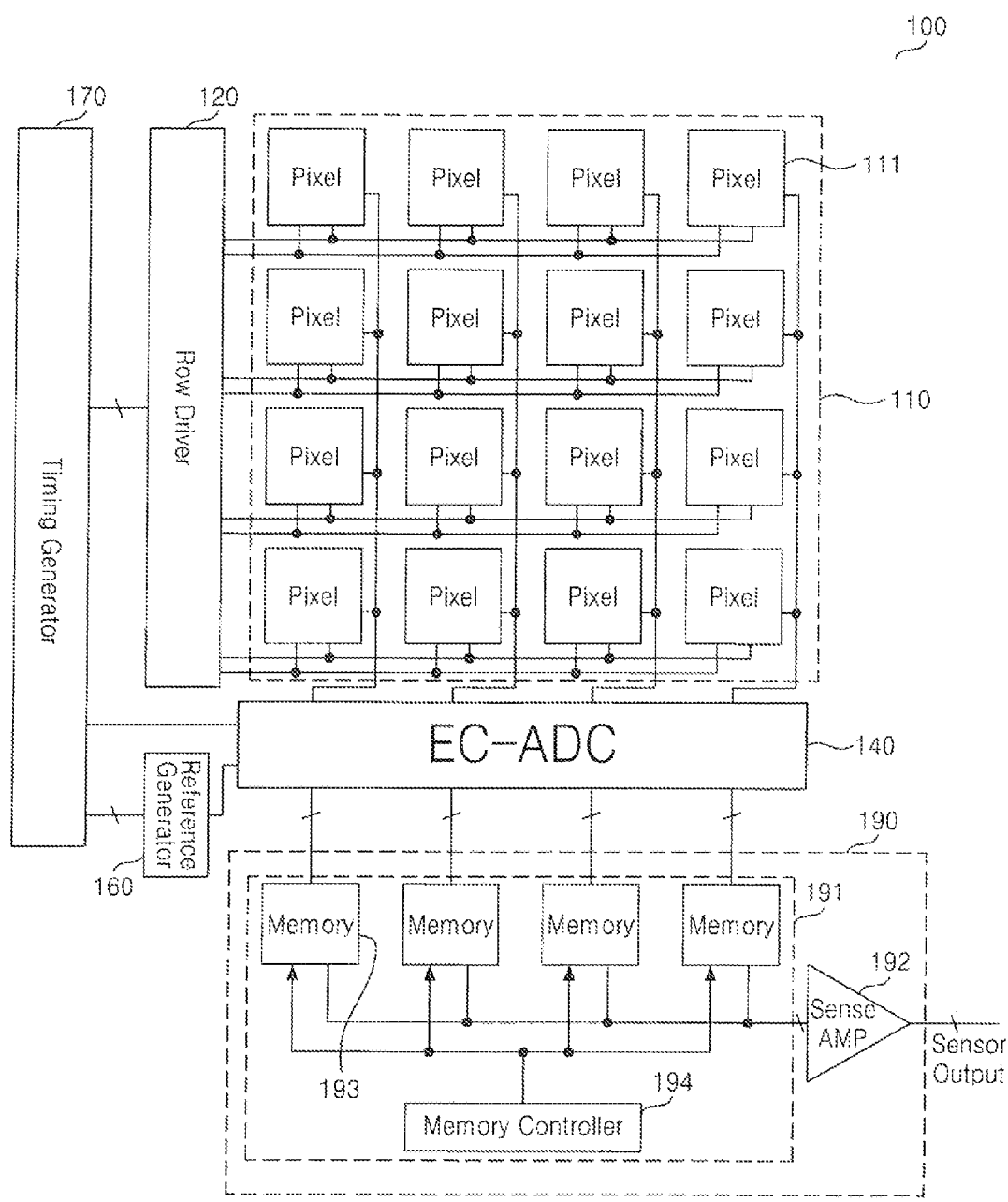
FIG. 2 is a detailed diagram of the image sensor illustrated in FIG. 1.

Referring now to FIG. 2, a block diagram of the image sensor 100 illustrated in FIG. 1 will be discussed. As illustrated in FIG. 2, the image sensor 100 includes the pixel array 110, the row driver 120, the EC-ADC 140, the reference generator 160, the timing generator 170, and the buffer 190.

The pixel array 110 includes a plurality of pixels 111 arranged in a matrix form, each of which is connected to one of a plurality of row lines and one of a plurality of column lines.

The row driver 120 may decode a row control signal, for example, an address signal, generated by the timing generator 170 and select at least one row line from among the row lines included in the pixel array 110 in response to a decoded row control signal.

The EC-ADC 140 may perform CDS on a pixel signal output from a pixel connected to one of the column lines included in the pixel array 110, output a result signal using reference signals output from the reference generator 160 and a CDS signal, count the result signal, and output a count result to the buffer 190. The reference generator 160 may operate based on a control signal generated by the timing generator 170.

The buffer 190 includes a column memory block 191 and a sense amplifier 192. The column memory block 191 includes a plurality of memories 193.

Each memory 193 may operate in response to a memory control signal generated by a memory controller. As illustrated in FIG. 2, the memory controller 194 may be positioned within the column memory block 191. However, embodiments of the present inventive concept are not limited to this configuration. For example, the memory controller may be positioned in the timing generator 170 and may be controlled by a control signal generated by the timing generator 170. In some embodiments, the memory 193 may be an SRAM.

In response to the memory control signal, the column memory block 191 temporarily stores a digital signal output from the EC-ADC 140 and then outputs it to the sense amplifier 192. The sense amplifier 192 senses and amplifies the digital signal before outputting it.

Figure 3A:
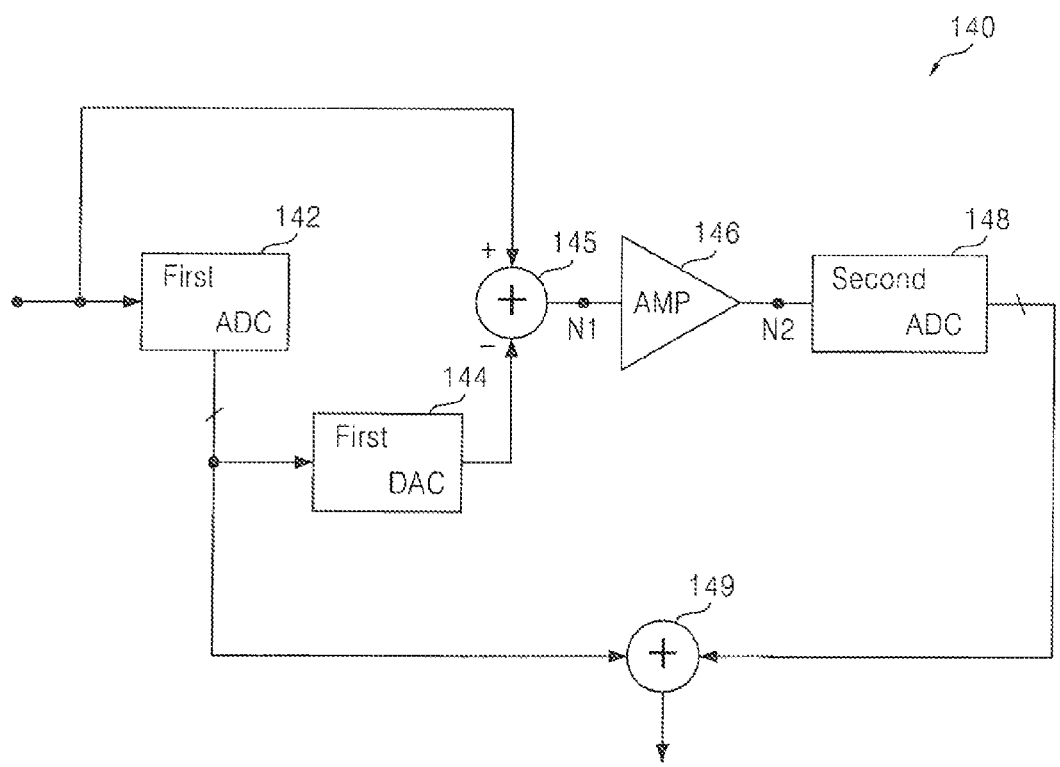
FIGS. 3A and 3B are conceptual diagrams illustrating an extended counting analog-to-digital converter (EC-ADC) illustrated in FIG. 2.
Figure 3B:
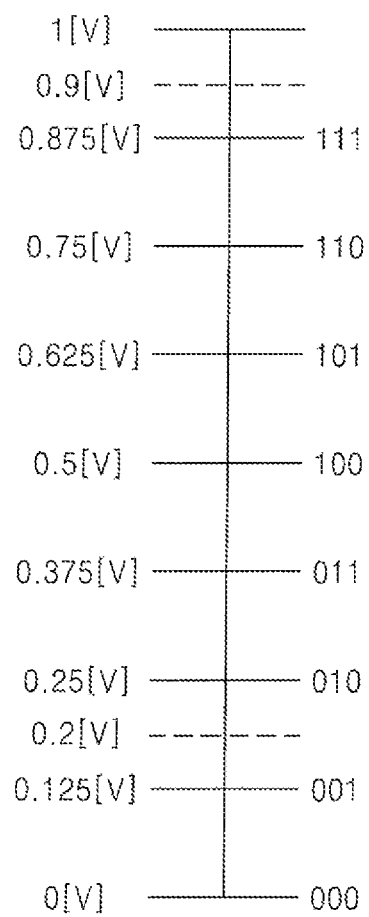

Referring now to FIGS. 3A and 3B, diagrams illustrating the EC-ADC 140 illustrated in FIG. 2 in accordance with some embodiments of the present inventive concept. Referring now to FIG. 3A, the EC-ADC 140 includes a first ADC 142, a first digital-to-analog converter (DAC) 144, a first adder 145, an amplifier 146, a second ADC 148, and a second adder 149.

The first ADC 142 receives a signal from the pixel array 110, converts it into a digital signal. The first DAC 144 converts an output signal of the first ADC 142 into an analog signal.

The first adder 145 adds an output signal of the first DAC 144 and an output signal of the pixel array 110. The amplifier 146 amplifies an output signal of the first adder 145. The second ADC 148 converts an output signal of the amplifier 146 into a digital signal.

The first ADC 142 may be an N-bit ADC, for example, a 3-bit ADC and the first DAC 144 may be an N-bit DAC, for example, a 3-bit DAC. However, the present inventive concept is not restricted to embodiments discussed herein. In some embodiments discussed below with respect to FIGS. 8 and 9, the first ADC 142 is a 2-bit ADC.

Referring now to FIG. 3B, when an analog signal input to the first ADC 142 and the first adder 145 is 0.9 V (here, the analog signal has a maximum magnitude of 1.0 V), the first ADC 142 converts the 0.9 V analog signal into a digital signal and outputs a value of 111.

The first DAC 144 converts the digital signal of 111 into an analog signal and outputs an analog signal of 0.875 V.

The first adder 145 adds the analog signal of 0.9 V and the analog signal of 0.875 V after putting a negative sign to 0.875 V. For example, the first adder 145 outputs an analog signal corresponding to a residue, i.e., 0.9 V+(−0.875 V)=0.025 V to the amplifier 146. The amplifier 146 amplifies the analog signal and outputs an amplified signal to the second ADC 148. At this time, when the amplifier 146 is a 3-bit amplifier, the amplifier 146 outputs a signal of 0.025 V×8=0.2 V.

The second ADC 148 converts the 0.2 V analog signal into a digital signal. For example, the second ADC 148 may be an M-bit ADC, e.g., a 3-bit ADC. In some embodiments, the 0.2 V analog signal is converted into a digital signal of 001. However, the present inventive concept is not restricted to these embodiments. The second ADC 148 is a 2-bit ADC in the embodiments illustrated in FIGS. 8 and 9.

The second adder 149 adds a digital signal output from the first ADC 142 and a digital signal output from the second ADC 148. When the first ADC 142 is an N-bit ADC and outputs a value of X and the second ADC 148 is an M-bit ADC and outputs a value of Y, the second adder 149 calculates $2^M \times X + Y$ and outputs a result.

In some embodiments, the first ADC 142 is a 3-bit ADC and outputs a value of 111 and the second ADC 148 is a 3-bit ADC and outputs a value of 001, and therefore, N=3, X=7, M=3, and Y=1. Accordingly, the second adder 149 calculates $2^3 \times 7 + 1$.

Figure 4:
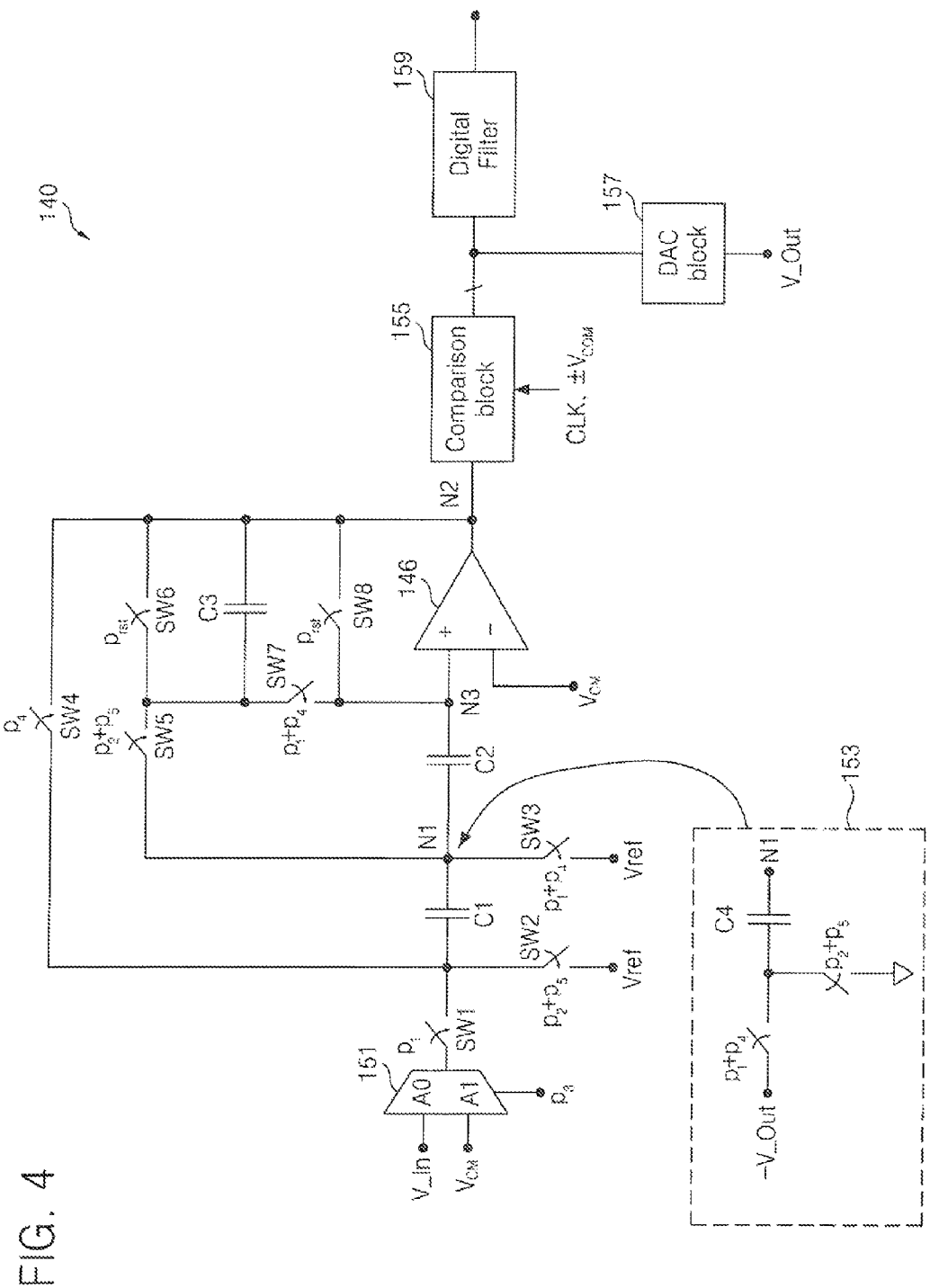
FIG. 4 is a detailed diagram of the EC-ADC illustrated in FIG. 3A according to some embodiments of the present inventive concept.
Figure 5:
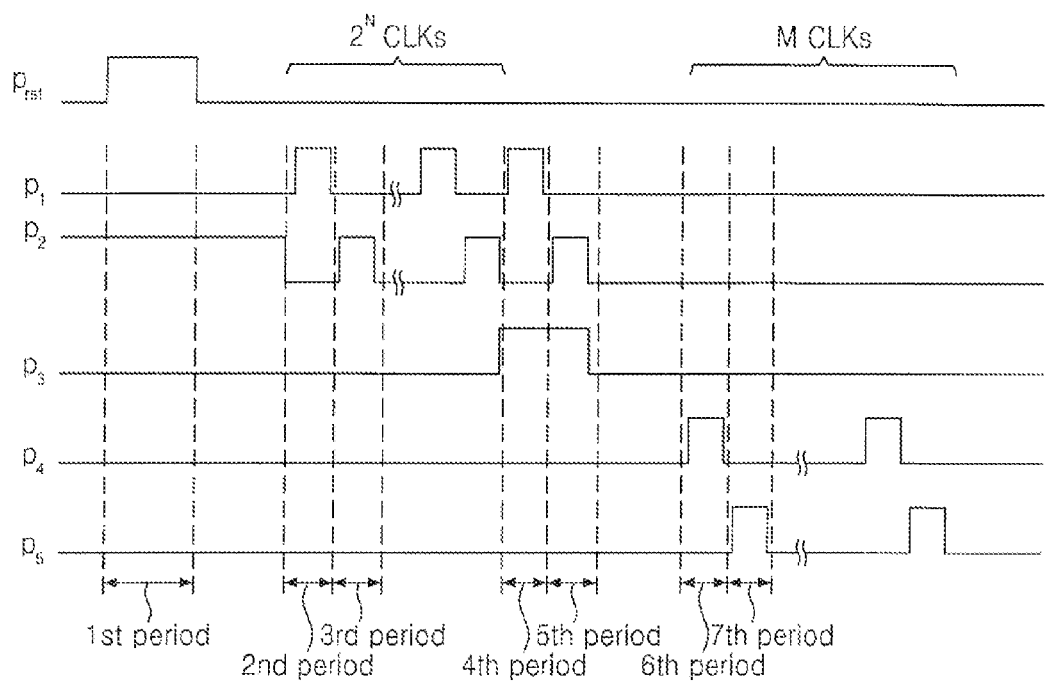
FIG. 5 is a diagram illustrating switch control signals illustrating operations of the EC-ADC illustrated in FIG. 4.
Figure 6A:
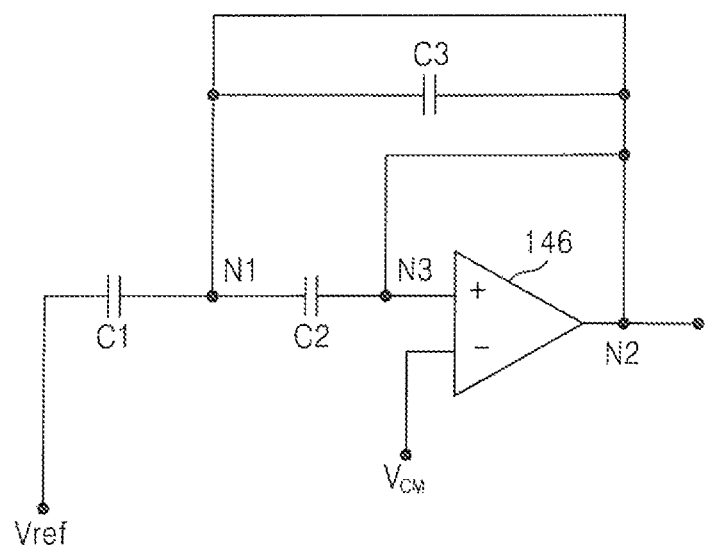
FIGS. 6A through 6C are diagrams illustrating operations of the EC-ADC according to the switch control signals illustrated in FIG. 5.
Figure 6B:
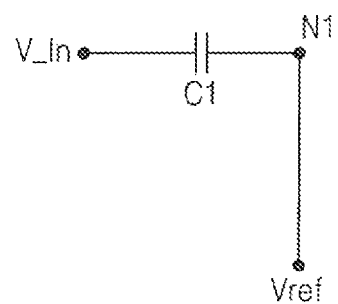
Figure 6C:
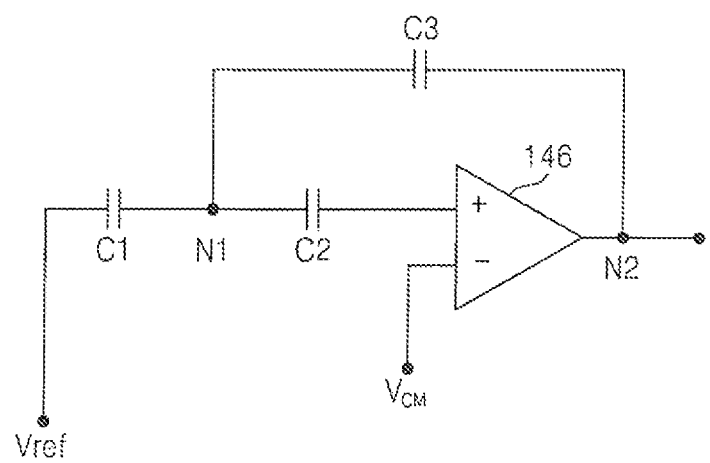
Figure 7:
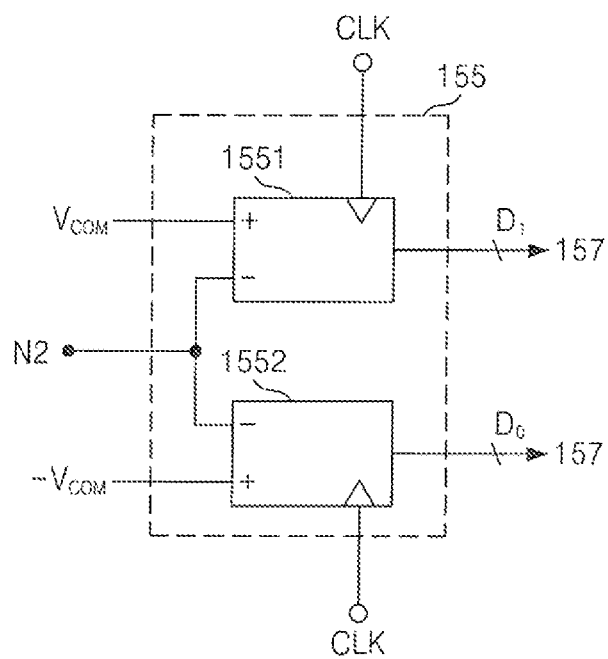
FIG. 7 is a diagram of a comparison block illustrated in FIG. 4 according to some embodiments of the present inventive concept.

FIG. 4 is a detailed diagram of the EC-ADC 140 illustrated in FIG. 3A according to some embodiments of the present inventive concept. FIG. 5 is a diagram illustrating switch control signals to explain the operation of the EC-ADC 140 illustrated in FIG. 4. FIGS. 6A through 6C are diagrams for explaining the operation of the EC-ADC 140 according to the switch control signals illustrated in FIG. 5. FIG. 7 is a diagram of a comparison block 155 illustrated in Figure according to some embodiments of the present inventive concept. FIG. 8 is a diagram for explaining the operation of the comparison block 155 illustrated in FIG. 7.

As illustrated in FIG. 4, the EC-ADC 140 includes a multiplexer 151, the amplifier 146, a comparison block 155, a DAC block 157, an adder block 153, and a digital filter 159. The multiplexer 151, a positive terminal of the amplifier 146, and the comparison block 155 are connected with one another via first through eighth switches SW1 through SW8 and first through third capacitors C1 through C3. A first reference signal $V_{CM}$ is input to a negative terminal of the amplifier 146. At this time, the amplifier 146, the first through eighth switches SW1 through SW8, and the first through third capacitors C1 through C3 may operate as an integrator according to the switching operation of the first through eighth switches SW1 through SW8.

A first node N1 and a second node N2 illustrated in FIG. 3A are the same as those N1 and N2 illustrated in FIG. 4. An inverted signal −V_Out of an output signal V_Out of the DAC block 157 is input to the first node N1 via a fourth capacitor C4 according to first through fifth control signals $p_1$ through $p_5$. A second reference signal $V_{ref}$ is input to the first and second nodes N1 and N2 via the third and second switches SW3 and SW2, respectively.

In particular, referring to FIGS. 5 and 6A through 6C, a reset control signal $p_{rst}$ and the second control signal $p_2$ are at a high level and the first, third through fifth control signals $p_1$, $p_3$ through $p_5$ are at a low level during a first period.

Referring to FIG. 6A, a diagram illustrating a part of the EC-ADC 140 during the first period will be discussed. As illustrated in FIG. 6A, since the reset control signal $p_{rst}$ and the second control signal $p_2$ are at the high level, the second, fifth, sixth and eighth switches SW2, SW5, SW6 and SW8 are closed and all of first through third nodes N1, N2, and N3 become a common node. Accordingly, voltages of the first through third nodes N1 through N3 are all the same.

Referring now to FIG. 6B, a diagram illustrating a part of the EC-ADC 140 during a second period will be discussed. As illustrated in 6B, since the first control signal $p_1$ is at a high level, the first and third switches SW1 and SW3 are closed. The multiplexer 151 outputs a signal V_In in response to the third control signal $p_3$ at the low level. As a result, the first capacitor C1 is charged with the signal V_In. At this time, the signal V_In may be an output signal of the pixel array 110 illustrated in FIG. 1.

Referring now to FIG. 6C, a diagram illustrating a part of the EC-ADC 140 during a third period. As illustrated in FIG. 6C, since the second control signal $p_2$ is at the high level, the second and fifth switches SW2 and SW5 are closed. A circuit illustrated in FIG. 6C operates as an integrator.

At this time, when it is assumed that the second and third periods form a single clock and the first ADC 142 illustrated in FIG. 3A is an N-bit ADC, $2^N$ clock operation is performed.

During fourth and fifth periods, the third control signal $p_3$ is at a high level. Accordingly, the multiplexer 151 outputs the first reference signal $V_{CM}$ and an integration result (e.g., a residue) calculated during a $2^N$-clock period is fed back, so that preparation for the operation of the second ADC 148 is performed.

The second ADC 148 illustrated in FIG. 3A operates during sixth and seventh periods. When the second ADC 148 is an M-bit ADC, M clock operation is performed.

During the sixth and seventh periods, the third control signal $p_3$ is at the low level, so that the multiplexer 151 outputs the signal V_In. The same operation as that performed during the second and third periods is performed using the integration result, for example, the residue.

Referring back to FIG. 4, the comparison block 155 converts a voltage output to the second node N2 by the amplifier 146 into a digital value based on an input clock signal CLK received from the timing generator 170 and comparison signals $V_{COM}$ and $-V_{COM}$ received from the reference generator 160.

The comparison block 155 may include at least one conversion block. Referring to FIG. 7, the comparison block 155 may include a first conversion block 1551 and a second conversion block 1552.

The first conversion block 1551 and the second conversion block 1552 receive the comparison signals $V_{COM}$ and $-V_{COM}$, respectively, the clock signal CLK, and a voltage signal of the second node N2. The first and second conversion blocks 1551 and 1552 convert the voltage signal of the second node N2 into digital signals $D_1$ and $D_0$, respectively, based on the comparison signals $V_{COM}$ and $-V_{COM}$, respectively.

Referring now to FIG. 8, when each of the first ADC 142 and the second ADC 148 illustrated in FIG. 3A is a 2-bit ADC and the comparison signals $V_{COM}$ and $-V_{COM}$ are 0.25 V and −0.25 V, respectively, the digital signals $D_1$ and $D_0$ are determined according to a range that the voltage signal of the second node N2 belongs to based on 0.25 V and −0.25 V.

For example, when the voltage signal of the second node N2 is 0.27 V, which is higher than 0.25 V, the digital signals $D_1$ and $D_0$ are both 1. When the voltage signal of the second node N2 is 0.2 V, which is lower than 0.25 V and higher than −0.25 V, the digital signals $D_1$ and $D_0$ are 0 and 1, respectively. When the voltage signal of the second node N2 is −0.27 V, which is lower than 0.25 V and −0.25 V, the digital signals $D_1$ and $D_0$ are both 0.

The DAC block 157 receives a digital value output from the comparison block 155 and converts the digital value into an analog signal V_Out.

The digital filter 159 accumulates digital values output from the comparison block 155. For example, the digital filter 159 may take 0 when receiving $D_1$=0 and $D_0$=0 from the comparison block 155, take 1 when receiving $D_1$=0 and $D_0$=1, and take 2 when receiving $D_1$=1 and $D_0$=1.

The digital filter 159 may accumulate a value of 0, 1, or 2 taken based on the digital signals $D_1$ and $D_0$ received from the comparison block 155 according to a predetermined number of clocks. At this time, the predetermined number of clocks may be determined by N when the EC-ADC 140 is an N-bit ADC.

Referring to FIG. 4, the EC-ADC 140 includes the adder block 153. The adder block 153 inverts the sign of the output signal V_Out of the DAC block 157 and outputs an inverted signal −V_Out to the first node N1 according to the first through fifth control signals $p_1$ through $p_5$.

For example, referring to FIGS. 4 and 5, the adder block 153 transmits the inverted signal −V_Out of the output signal V_Out of the DAC block 157 to the first node N1 during the second and fourth periods during which the first control signal $p_1$ is at the high level.

Consequently, the EC-ADC 140 performs the same function as the first ADC 142 illustrated in FIG. 3A during the $2^N$-clock period including the second and third periods and performs the same function as the second ADC 148 illustrated in FIG. 3A during an M-clock period including the sixth and seventh periods.

FIG. 9 is a diagram illustrating output signals of the reference generator 160 illustrated in FIG. 1. Referring to FIGS. 1, 3A, 3B, 4, 5, and 9, the reference generator 160 generates and outputs the first reference signal $V_{CM}$, the second reference signal $V_{ref}$ and the comparison signals $±V_{COM}$ to the EC-ADC 140. At this time, the first ADC 142 and the second ADC 148 illustrated in FIG. 3A may be 2-bit ADCs, as illustrated in FIG. 8.

The first reference signal $V_{CM}$ and the comparison signals $±V_{COM}$ are input to the comparison block 155. The second reference signal $V_{ref}$ includes a positive signal $V_{refH}$ and a negative signal $V_{refL}$ and may be a signal that determines a voltage range of the EC-ADC 140. For example, when the voltage range is 1 V as illustrated in FIG. 3B, the positive signal $V_{refH}$ may be 0.5 V and the negative signal $V_{refL}$ may be −0.5 V.

The comparison signals $±V_{COM}$ may be differently input during the $2^N$-clock period and the M-clock period and include a positive signal and a negative signal. Referring to FIG. 9, the comparison signals $±V_{COM}$ includes a positive signal $V_{COM1}$ of 0.25 V and a negative signal $-V_{COM1}$ of −0.25 V during the $2^N$-clock period and a positive signal $V_{COM2}$ of 0.125 V and a negative signal $-V_{COM2}$ of −0.125 V during the M-clock period.

The positive signals $V_{COM1}$ and $V_{COM2}$ and the negative signals $-V_{COM1}$ and $-V_{COM2}$ may be determined based on the first reference signal $V_{CM}$.

Figure 10:
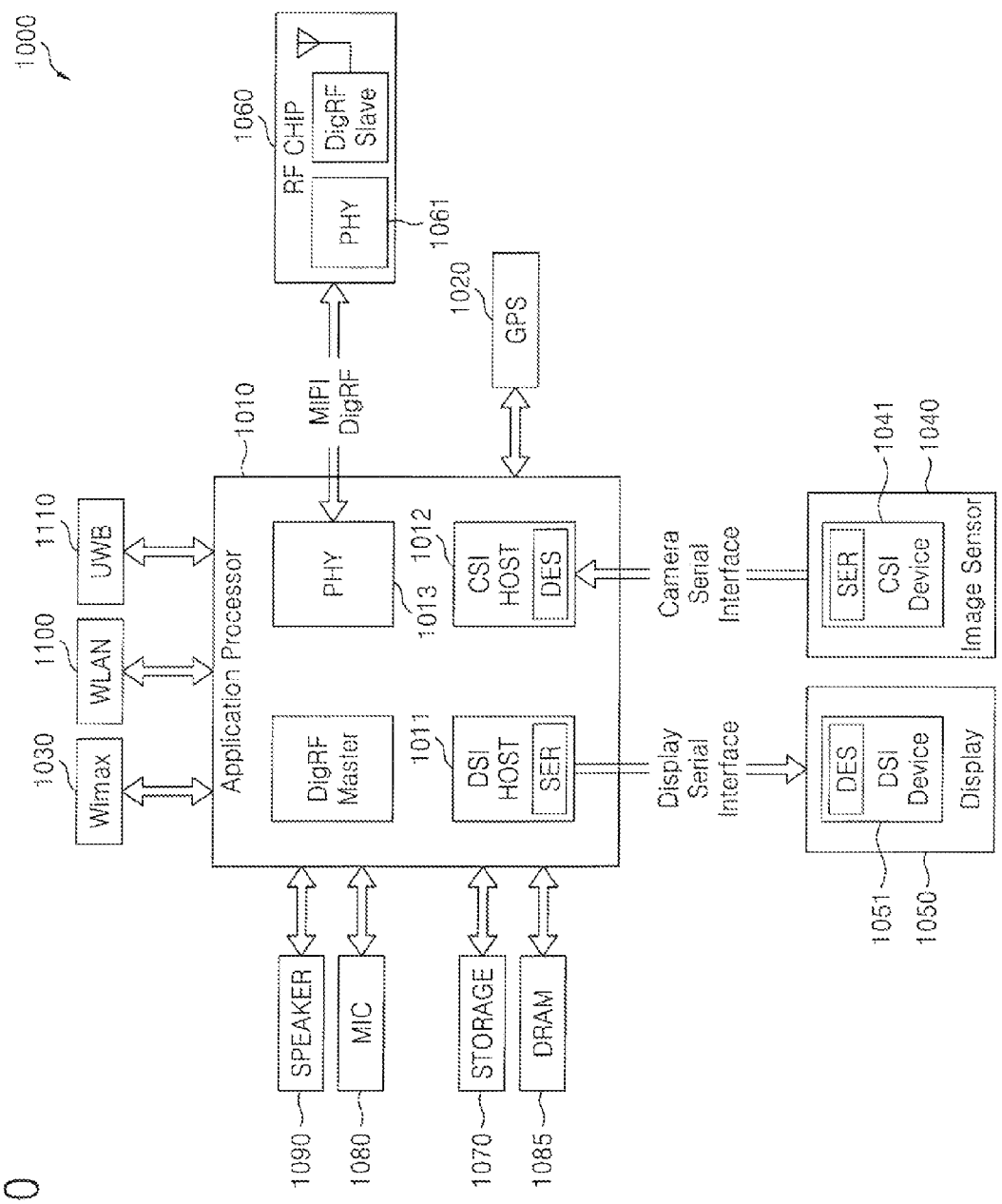
FIG. 10 is a block diagram of an electronic system including an image sensor according to some embodiments of the present inventive concept.

Referring now to FIG. 10, a block diagram of an electronic system including an image sensor according to some embodiments of the present inventive concept will be discussed. The electronic system 1000 may be implemented by a data processing apparatus, such as a mobile phone, a personal digital assistant (PDA), a portable media player (PMP), an IP TV, or a smart phone that can use or support the MIPI interface. The electronic system 1000 includes an application processor 1010, an image sensor 1040, and a display 1050.

A Camera Serial Interface (CSI) host 1012 included in the application processor 1010 performs serial communication with a CSI device 1041 included in the image sensor 1040 through CSI. For example, an optical deserializer may be implemented in the CSI host 1012, and an optical serializer may be implemented in the CSI device 1041.

A Display Serial Interface (DSI) host 1011 included in the application processor 1010 performs serial communication with a DSI device 1051 included in the display 1050 through DSI. For example, an optical serializer may be implemented in the DSI host 1011, and an optical deserializer may be implemented in the DSI device 1051.

The electronic system 1000 may also include a radio frequency (RF) chip 1060 which communicates with the application processor 1010. A physical layer (PHY) 1013 of the electronic system 1000 and a PHY 1061 of the RF chip 1060 communicate data with each other according to a MIPI DigRF standard. The electronic system 1000 may further include at least one element among a GPS 1020, a storage device 1070, a microphone 1080, a DRAM 1085 and a speaker 1090. The electronic system 1000 may communicate using Wimax 1030, WLAN 1100 or UWB 1110, etc.

As described above, according to some embodiments of the present inventive concept, an ADC and an image sensor including the same satisfy the performance for high speed, high resolution and low power.

While the present inventive concept has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. An image sensor comprising:
    a pixel array comprising a plurality of pixels arranged in a matrix of a plurality of rows and columns, each of the plurality of pixels being configured to convert intensity of incident light into an electrical image signal; and
    an extended counting analog-to-digital converter configured to:
        perform a first analog-to-digital conversion to provide a digital signal from an output signal of the pixel array;
        obtain a residue using the output signal of the pixel array and the digital signal; and
        perform a second analog-to-digital conversion using the residue, wherein the extended counting analog-to-digital converter comprises:
    an integrator configured to integrate one of the output signal of the pixel array and a first reference signal;
    a comparison block configured to convert an output signal of the integrator into a digital signal based on at least one comparison signal;
    a digital-to-analog converter block configured to perform digital-to-analog conversion on an output signal of the comparison block; and
    an adder block configured to invert a sign of an output signal of the digital-to-analog converter block and output an inverted signal to an input terminal of the integrator.

2. The image sensor of claim 1, wherein the extended counting analog-to-digital converter further comprises a digital filter configured to accumulate the output signal of the comparison block.

3. The image sensor of claim 1, further comprising a reference generator configured to generate the first reference signal and the at least one comparison signal.

4. The image sensor of claim 1, wherein the extended counting analog-to-digital converter further comprises a multiplexer configured to selectively output one signal among the output signal of the pixel array and the first reference signal.

5. An analog-to-digital converter comprising:
    a multiplexer configured to selectively output one of an output signal of a pixel array and a first reference signal;
    an integrator configured to integrate an output signal of the multiplexer;
    a comparison block configured to convert an output signal of the integrator into a digital signal based on at least one comparison signal and output a first output signal;
    a digital-to-analog converter block configured to perform digital-to-analog conversion on the first output signal received from the comparison block;
    an adder block configured to invert a sign of an output signal of the digital-to-analog converter block and output an inverted signal to an input terminal of the integrator; and
    a digital filter configured to accumulate the first output signal of the comparison block.

6. The analog-to-digital converter of claim 5, wherein the integrator comprises an amplifier having an input terminal connected with an output terminal of the multiplexer via at least one capacitor, at least one switch and at least one capacitor are connected in parallel between the input terminal of the amplifier and an output terminal of the amplifier, and at least one of two terminals of the at least one capacitor is connected with one of the input and output terminals of the amplifier.

7. The analog-to-digital converter of claim 6, wherein the output terminal of the multiplexer is connected with the at least one capacitor via a first switch.

8. The analog-to-digital converter of claim 7, wherein a second reference signal is input to terminals of the at least one capacitor except for a terminal connected to the input terminal of the amplifier according to a switching signal.

9. The analog-to-digital converter of claim 8, wherein the integrator is configured to integrate the output signal of the multiplexer according to an operation of the at least one switch and the switching signal.

10. The analog-to-digital converter of claim 9, wherein the integrator performs an operation on an output feedback signal received from the adder block through an input terminal and the output signal of the pixel array and obtains a residue.

11. The analog-to-digital converter of claim 10, wherein the comparison block is configured to convert the residue obtained by the integrator into a digital signal and output a second output signal, and the digital filter is configured to accumulate the first output signal and the second output signal of the comparison block.

12. The analog-to-digital converter of claim 11, wherein the comparison block receives the at least one comparison signal from a reference generator, and wherein the at least one comparison signal, magnitude of a comparison signal input to the comparison block when the comparison block output the first output signal is different from magnitude of a comparison signal input to the comparison block when the comparison block output the second output signal.

13. An electronic system, comprising:

an image sensor; and an application processor configured to perform serial communication with the image sensor through a camera serial interface, wherein the image sensor comprises:

a pixel array comprising a plurality of pixels arranged in a matrix of a plurality of rows and columns, each of the plurality of pixels being configured to convert intensity of incident light into an electrical image signal; and an extended counting analog-to-digital converter configured to:

perform a first analog-to-digital conversion to provide a digital signal from an output signal of the pixel array;

obtain a residue using the output signal of the pixel array and the digital signal; and perform a second analog-to-digital conversion using the residue, wherein the extended counting analog-to-digital converter comprises:

an integrator configured to integrate one of the output signal of the pixel array and a first reference signal;

a comparison block configured to convert an output signal of the integrator into a digital signal based on at least one comparison signal;

a digital-to-analog converter block configured to perform digital-to-analog conversion on an output signal of the comparison block; and an adder block configured to invert a sign of an output signal of the digital-to-analog converter block and output an inverted signal to an input terminal of the integrator.

14. The electronic system of claim 13, wherein the electronic system implemented by a device that can use or support a MIPI interface.

15. The electronic system of claim 14, wherein the device comprises a mobile phone, a personal digital assistant (PDA), a portable media player (PMP), an IPTV, or a smart phone.

* * * * *